(12) United States Patent
Nishizawa

(10) Patent No.: US 9,195,245 B2
(45) Date of Patent: Nov. 24, 2015

(54) OUTPUT BUFFER CIRCUIT

(71) Applicant: MegaChips Corporation, Osaka-shi (JP)

(72) Inventor: Yuuki Nishizawa, Urayasu (JP)

(73) Assignee: MegaChips Corporation, Osaka-shi (JP)

( * ) Notice: Subject to any disclaimer, the term of this patent is extended or adjusted under 35 U.S.C. 154(b) by 0 days.

(21) Appl. No.: 14/013,467

(22) Filed: Aug. 29, 2013

(65) Prior Publication Data

US 2014/0062568 A1  Mar. 6, 2014

(30) Foreign Application Priority Data

Sep. 3, 2012  (JP) ................................. 2012-192802
Aug. 26, 2013  (JP) ................................. 2013-174268

(51) Int. Cl.
*H03B 1/00* (2006.01)
*G05F 1/10* (2006.01)
*H03F 3/45* (2006.01)

(52) U.S. Cl.
CPC ... *G05F 1/10* (2013.01); *H03F 3/45* (2013.01)

(58) Field of Classification Search
USPC ........ 327/65–67, 108–112, 389, 391; 326/26, 326/27, 83, 87
See application file for complete search history.

(56) References Cited

U.S. PATENT DOCUMENTS

| 5,939,904 | A  * | 8/1999 | Fetterman et al. ............... 327/67 |
| 6,356,141 | B1 * | 3/2002 | Yamauchi ...................... 327/108 |
| 7,696,793 | B2 * | 4/2010 | Sunairi ........................ 327/108 |
| 7,880,512 | B2   | 2/2011 | Takeuchi |

FOREIGN PATENT DOCUMENTS

| JP | 11-330947   | 11/1999 |
| JP | 2009-152944 | 7/2009  |

* cited by examiner

*Primary Examiner* — Long Nguyen
(74) *Attorney, Agent, or Firm* — Oblon, McClelland, Maier & Neustadt, L.L.P.

(57) ABSTRACT

A differential output buffer includes first and third switches and second and fourth switches which are connected in series respectively between a first voltage source and a current source, and a replica circuit includes a second voltage source which is equivalent to a first voltage source. A current control circuit controls a current flowing to the current source in such a manner that a voltage of a third node between two resistive elements connected in series between a first node between the first and third switches and a second node between the second and fourth switches and having an equal resistance value is equal to a reference voltage, for example, and a voltage control circuit generates a control signal in such a manner that a voltage of any node excluding an output terminal of the second voltage source in the current path is equal to a second reference voltage.

6 Claims, 6 Drawing Sheets

F I G. 1
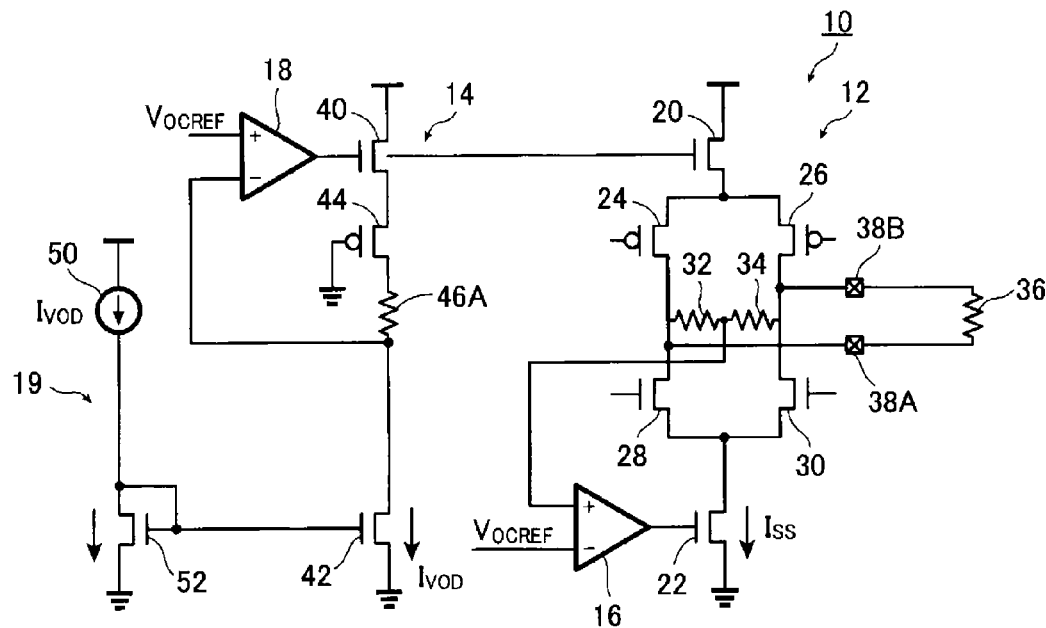
F I G. 2
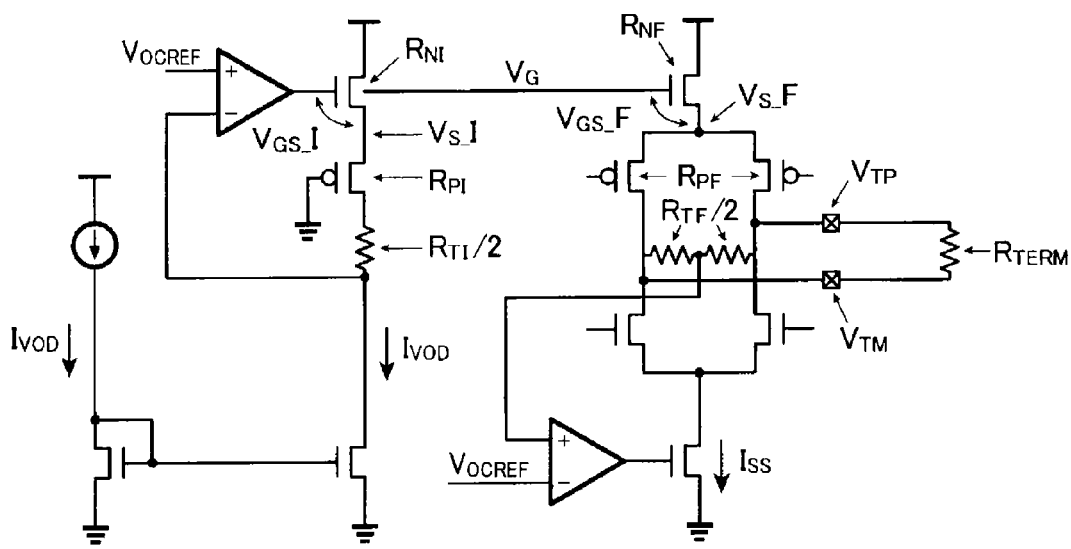

OUTPUT DIFFERENTIAL SIGNAL

OUTPUT BUFFER CIRCUIT

BACKGROUND OF THE INVENTION

1. Field of the Invention

The present invention relates to an output buffer circuit for outputting a differential signal defined by a common mode voltage and an amplitude.

2. Description of the Background Art

There is known a differential buffer having a structure in which a built-in terminating resistor is additionally provided between differential signals to be output from an output buffer circuit of a constant current type as shown in FIG. 10. Referring to an architecture of an output buffer circuit of a constant current type represented by a structure of an output buffer circuit compatible with the interface standard such as an LVDS (Low Voltage Differential Signaling) or a mini-LVDS in which a common mode voltage and an amplitude in a differential signal are defined in the differential buffer, there is used a structure in which a current source is disposed between a power supply and a ground, and a differential switch respectively.

A voltage having a high potential (H) and a voltage having a low potential (L) in a differential signal are represented by $V_{TP}$ and $V_{TM}$, respectively. As shown in FIG. 9, a common mode voltage $V_{OC}$ of the differential signal is represented by a central voltage ($V_{OC}=(V_{TP}+V_{TM})/2$) between an H voltage $V_{TP}$ and an L voltage $V_{TM}$ in the differential signal. Moreover, a voltage $V_{OD}$ having an amplitude of the differential signal is represented by a differential voltage ($|V_{OD}|=|V_{TP}-V_{TM}|$) between the H voltage $V_{TP}$ and the L voltage $V_{TM}$ in the differential signal.

However, the output buffer circuit of the constant current type has a problem in that a slew rate of the differential signal is limited due to a high impedance caused by the current source and an operating speed is lower under the same power consumption condition as compared with an output buffer circuit of a constant voltage type.

In contrast, if a resistance value of a combined resistor of a built-in terminating resistor and an external terminating resistor is reduced to be a half of a resistance value of the external terminating resistor in the structure of FIG. 10, it is possible to obtain an operating band which is equivalent to a differential signal of the output buffer circuit of the constant voltage type but a consumption current is doubled.

On the other hand, in some output buffer circuits of the constant voltage type according to the related art, a voltage source constituted by a source follower is generally disposed between a power supply and a differential switch and between ground and a differential switch as shown in FIG. 11. With this structure, however, an amplitude and a common mode voltage in a differential signal cannot be controlled and both of voltage sources are source followers. For this reason, the amplitude of the differential signal is also limited by a threshold voltage of an MOS constituting the voltage source.

In contrast, some existing output buffer circuits of the constant voltage type which can control the amplitude of the differential signal have a structure in which one of the voltage sources in the output buffer circuit of the constant voltage type shown in FIG. 11, that is, a voltage source on a ground side in the example of FIG. 12 is eliminated and a differential switch is directly connected to the ground and control is carried out by an operational amplifier in such a manner that a reference voltage and a voltage supplied from a voltage source on a power supply side are equal to each other as shown in FIG. 12.

With this structure, however, the amplitude of the differential signal is obtained with respect to the ground. Therefore, a common mode voltage has amplitude dependency. For this reason, in some cases in which the amplitude is increased, the common mode voltage is also raised and thus gets out of a receivable common mode voltage range on a receiving side where the differential signal is to be received. Consequently, there is a problem in that an amplitude range which can be output is limited. Moreover, there is a problem in that the common mode voltage is varied depending on a value of a terminating resistor at the receiving side or a resistor on a transmission line.

As shown in FIG. 13, furthermore, it is also possible to employ a structure in which the common mode voltage can be controlled in place of the amplitude of the differential signal. In this case, the amplitude of the differential signal cannot be controlled. In addition, it is possible to suppose that a separate operational amplifier from an operational amplifier for amplitude regulation is used to regulate a common mode voltage without depending on an amplitude. When two feedback controls are carried out at the same time, however, they influence on each other so that a stable operation cannot be performed.

The prior art document related to the present invention includes Japanese Patent Application Laid-Open Nos. 2009-152944 and 11-330947.

The Japanese Patent Application Laid-Open No. 2009-152944 describes the output driver circuit having the structure in which there are provided the driver circuit having the voltage source and the current source disposed between the power supply and the differential switch and between ground and the differential switch respectively, and the replica circuit of the driver circuit, the control signal for controlling the reference voltage and the voltage of the predetermined node of the replica circuit to be equal to each other is generated by the operational amplifier, and the control signal is input to the voltage source on the power supply side of the driver circuit and the gate of the voltage source on the power supply side of the replica circuit.

The Japanese Patent Application Laid-Open No. 11-330947 describes the LVDS output buffer in which the internal resistors R1 and R2 having an equal value are disposed in series between the outputs Z and ZB of the differential signal, the feedback loop based on the OPAMP is used to compare the common mode voltage VMID in the node MID in the middle of the internal resistors R1 and R2 with the desirable output voltage VCM, and the current derived from the current source on the ground side is controlled in response to the output of the OPAMP.

With the structure according to the Japanese Patent Application Laid-Open No. 2009-152944, however, the slew rate is limited on the current source side and is not limited on the voltage source side. For this reason, the common mode voltage fluctuates in the output switching.

Moreover the structure according to the Japanese Patent Application Laid-Open No. 11-330947 provides the circuit capable of setting the common mode voltage through the VCM. However, the output buffer circuit is of the constant current type. In the same manner as in the case of the Japanese Patent Application Laid-Open No. 2009-152944, therefore, the fluctuation in the common mode voltage has a problem.

SUMMARY OF THE INVENTION

It is an object to provide an output buffer circuit of a constant voltage type which can carry out a high speed operation and can independently regulate an amplitude and a common mode voltage in a differential signal.

An output buffer circuit according to the present invention includes a differential output buffer, a replica circuit, a current control circuit and a voltage control circuit, and the differential output buffer includes a first voltage source, a current source, and first and third switches and second and fourth switches which are connected in series respectively between an output terminal of the first voltage source and the current source, a terminating resistor is connected between a first node between the first and third switches and a second node between the second and fourth switches, and a differential output signal is output to the terminating resistor, a set of the first and fourth switches and a set of the second and third switches are controlled in such a manner that one of the sets is turned ON and the other set is turned OFF in response to a differential input signal input from a former circuit respectively, the current control circuit controls a current which flows to the current source in such a manner that a voltage of a third node is equal to a first reference voltage, the third node being a node between fourth and fifth resistive elements having an equal resistance value and connected in series between the first node and the second node or a node between the third and fourth switches and the current source, the replica circuit includes at least a second voltage source which is controlled in response to a common control signal to the first voltage source and outputs the same voltage as that generated by the first voltage source to an output terminal, a fifth switch which is connected to an output terminal of the second voltage source and is equivalent to the first or second switch in an ON state, and a constant current source for causing a constant current to flow to a current path including the second voltage source and the fifth switch, and the voltage control circuit generates the control signal in such a manner that a voltage of a fourth node is equal to a second reference voltage, the fourth node being any node excluding the output terminal of the second voltage source in the current path of the replica circuit through which the constant current flows.

It is preferable that the current path of the replica circuit should further include a first resistive element having a resistance value which is equivalent to a half of a resistance value of the terminating resistor and connected to the output terminal of the second voltage source through the fifth switch, and the fourth node should be a node provided on an opposite side to the fifth switch in the first resistive element.

Moreover, it is preferable that the third node should be a node provided between the fourth and fifth resistive elements, and the first reference voltage and the second reference voltage should be common reference voltages.

Furthermore, it is preferable that the current path of the replica circuit should further include a sixth switch which is equivalent to the third or fourth switch in the ON state, and a sixth resistive element connected between the fifth switch and the sixth switch and having a resistance value which is equivalent to a resistance value of the terminating resistor, the third node should be a node provided between the third and fourth switches and the current source, and the constant current source should include a constant current source transistor having a gate to which a current setting voltage is supplied and a drain connected to the current path, and the current source should include a current source transistor having a drain connected to the third and fourth switches, a gate to which a current control signal generated by comparison between the voltage of the third node and the first reference voltage through the current control circuit is supplied, and a source connected to the constant current transistor in common, and the first reference voltage should be supplied from the drain of the constant current source transistor.

In addition, it is preferable that the current path of the replica circuit should further include a sixth resistive element having a resistance value which is equivalent to a resistance value of the terminating resistor and connected to the output terminal of the second voltage source through the fifth switch, and the fourth node should be a node provided on an opposite side to the fifth switch in the sixth resistive element.

Moreover, it is preferable that the output buffer circuit should further include an amplitude regulating circuit for regulating a constant current caused to flow by the constant current source depending on an amplitude of the differential output signal.

Furthermore, it is preferable that the output buffer circuit should further include second and third resistive elements inserted in the first node, and seventh and eighth resistive elements inserted in the second node.

According to the present invention, the output buffer circuit is of a constant voltage type. Therefore, it is possible to carry out a higher speed operation under the same power consumption condition as compared with an output buffer circuit of a constant current type. By properly regulating a current flowing to the second current source of the replica circuit, moreover, it is possible to adjust an amplitude of the differential signal output from the differential output buffer and to regulate a common mode voltage independently of the adjustment of the amplitude.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram showing a first preferred embodiment, illustrating a structure of an output buffer circuit according to the present invention;

FIG. 2 is a conceptual diagram showing a voltage, a current and a resistance value in each portion of the output buffer circuit illustrated in FIG. 1;

DESCRIPTION OF THE PREFERRED EMBODIMENTS

Figure 3:
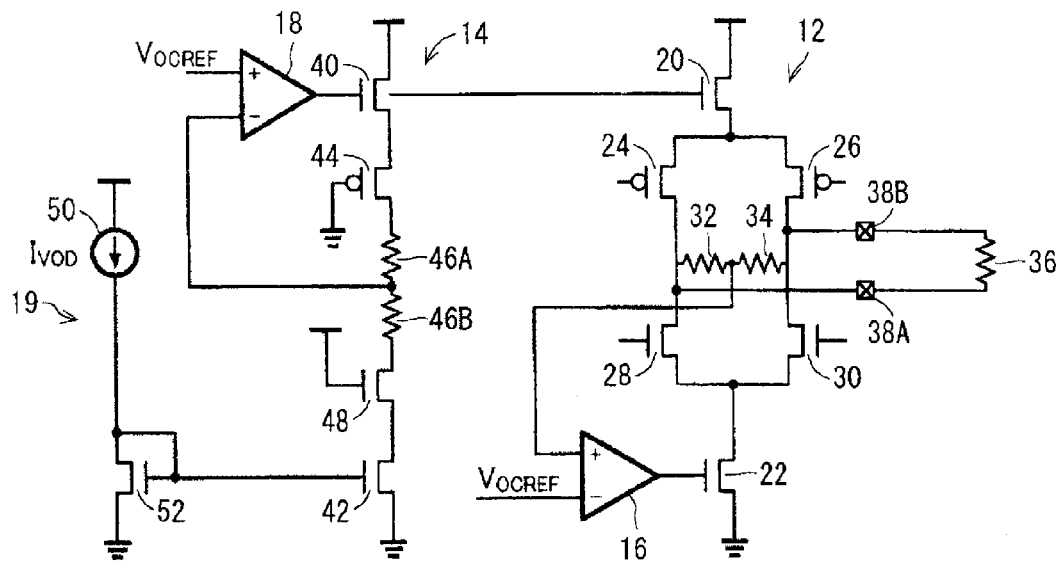
FIG. 3 is a circuit diagram showing a second preferred embodiment, illustrating the structure of the output buffer circuit according to the present invention.

An output buffer circuit according to the present invention will be described below in detail based on preferred embodiments shown in the accompanying drawings.

FIG. 1 is a circuit diagram showing a first preferred embodiment, illustrating a structure of the output buffer circuit according to the present invention. An output buffer circuit 10 shown in FIG. 1 is of a constant voltage type and includes a differential output buffer 12, a replica circuit 14, operational amplifiers 16 and 18, and a constant current generating circuit 19.

The differential output buffer 12 includes an NMOS (an N-type MOS transistor) 20 (a first voltage source) serving as a voltage source for supplying a predetermined voltage to the differential output buffer 12, an NMOS 22 (a current source) serving as a current source for causing a predetermined current to flow to a ground, PMOS (P-type MOS transistors) 24 and 26 (first and second switches) and NMOSs 28 and 30 (third and fourth switches) serving as differential switches, and two resistive elements 32 and 34 (fourth and fifth resistive elements) having an equal resistance value.

The NMOS 20 serving as a source follower circuit is connected to a power supply (a first power supply) and the NMOS 22 is connected to a ground (a second power supply). The PMOS 24 and the NMOS 28 (the first and third switches) and the PMOS 26 and the NMOS 30 (the second and fourth switches) are connected in series between the NMOS 20 and the NMOS 22, respectively. The resistive elements 32 and 34 are connected in series between a node (a first node) between the PMOS 24 and the NMOS 28 and a node (a second node) between the PMOS 26 and the NMOS 30.

A set of the PMOS 24 and the NMOS 30 and a set of the PMOS 26 and the NMOS 28 are controlled in such a manner that one of the sets is turned ON and the other set is turned OFF in response to a differential signal input from a former circuit, which is not shown. Moreover, a differential signal of the differential output buffer 12 is output from the first and second nodes to an outside of the output buffer circuit 10 through external output terminals 38A and 38B, and an external terminating resistor 36 is connected to a portion between the differential signals (between the external output terminals 38A and 38B).

Subsequently, a voltage (corresponding to a common mode voltage) of a node (a third node) between the resistive elements 32 and 34 is input (common mode fed back) to a positive terminal of the operational amplifier 16 (a current control circuit), and a reference voltage $V_{OCREF}$ (a first reference voltage) supplied from the outside of the output buffer circuit 10 is input to a negative terminal. The operational amplifier 16 outputs a current control signal for controlling a current flowing to the NMOS 22 in such a manner that the reference voltage $V_{OCREF}$ is equal to the voltage of the third node. The control signal output from the operational amplifier 16 is input to a gate of the NMOS 22.

In addition, the replica circuit 14 is constituted by simulating the differential output buffer 12 and includes an NMOS 40 (a second voltage source) corresponds to the NMOS 20 of the differential output buffer 12 and serving as a source follower circuit, an NMOS 42 (a constant current source) corresponding to the NMOS 22, a PMOS 44 (a fifth switch) corresponding to the PMOS 24 or the PMOS 26 in an ON state, and a resistive element 46A (a first resistive element) having a resistance value which is a half of that of the external terminating resistor 36.

The NMOS 40, the PMOS 44, the resistive element 46A and the NMOS 42 in the replica circuit 14 are connected in series in this order between a power supply (a first power supply) and a ground (a third power supply). Moreover, a gate of the PMOS 44 is connected to the ground (the third power supply).

Sizes of the PMOS 44 and the NMOSs 40 and 42 which constitute the replica circuit 14 are 1/m times (m is a positive number) as large as those of the PMOS 24 and 26 and the NMOSs 20, 22, 28 and 30 which constitute the differential output buffer 12, and the resistive element 46A has a resistance value which is m/2 times as great as that of the terminating resistor 36. In the present preferred embodiment, there is shown an example in which m is equal to one. Moreover, the single replica circuit 14 can be shared by the differential output buffers 12.

Furthermore, a reference voltage $V_{OCREF}$ (a second reference voltage) is input to a positive terminal of the operational amplifier 18 (the voltage control circuit), and a voltage (corresponding to a common mode voltage) of a node (a fourth node) between the resistive element 46A and the NMOS 42 is input to a negative terminal. The operational amplifier 18 outputs a voltage control signal for controlling a voltage supplied from the NMOS 40 to the replica circuit 14 in such a manner that the reference voltage $V_{OCREF}$ is equal to the voltage of the fourth node. The control signal output from the operational amplifier 18 is input to gates of the NMOS 40 and the NMOS 20.

Finally, the constant current generating circuit 19 serves to generate a current flowing to the NMOS 42, that is, the replica circuit 14, and furthermore, the differential output buffer 12 when an output signal does not make a transition, and includes a constant current source 50 for causing a constant current $I_{VOD}$ to flow and an NMOS 52.

The constant current source 50 and the NMOS 52 constitute an amplitude regulating circuit for regulating a constant current which is caused to flow by the NMOS 42 serving as the constant current source depending on the specification of an amplitude of a differential output signal, and are connected in series between the power supply (the first power supply) and the ground (the third power supply). A gate of the NMOS 52 and that of the NMOS 42 in the replica circuit 14 are connected to a node between the constant current source 50 and the NMOS 52. In other words, a current setting voltage for determining a current caused to flow to a current path of the replica circuit 14 is input to the gate of the NMOS 42, and the NMOSs 42 and 52 constitute a current mirror circuit.

In other words, the NMOS 42 serving as the constant current source causes a constant current to flow to a current path including the NMOS 40 serving as the second voltage source and the PMOS 44 serving as the fifth switch.

A size of the NMOS 52 in the constant current generating circuit 19 is 1/s times (s is a positive integer) as large as that of the NMOS 42 in the replica circuit 14. In the present preferred embodiment, there is shown an example of s=1 (a mirror ratio=1:1). Moreover, the single constant current generating circuit 19 can be shared by the replica circuits 14.

Next, an operation of the output buffer circuit 10 will be described.

The constant current $I_{VOD}$ supplied from the constant current source 50 of the constant current generating circuit 19 flows to a ground through the NMOS 52. The constant current $I_{VOD}$ flowing to the NMOS 52 is mirrored from the NMOS 52 into the NMOS 42 of the replica circuit 14 by the current mirror circuit and thus flows to the NMOS 42. In other words, in the replica circuit 14, the constant current $I_{VOD}$ flows from a power supply to a ground through the NMOS 40, the PMOS 44, the resistive element 46A and the NMOS 42.

Moreover, a control signal for controlling a voltage to be supplied from the NMOS 40 to the replica circuit 14 is output from the operational amplifier 18 in such a manner that the reference voltage $V_{OCREF}$ is equal to the voltage of the fourth node between the resistive element 46A and the NMOS 42 in the replica circuit 14, and is input to the gates of the NMOS 40 and the NMOS 20.

Referring to the differential output buffer 12, the replica circuit 14 is constituted by simulating the differential output buffer 12, the control signal sent from the operational amplifier 18 is input to the gates of the NMOSs 40 and 20 in common, and a voltage is supplied from the NMOS 20 to the differential output buffer 12. A control signal for controlling the gate of the NMOS 22 is output from the operational amplifier 16 in such a manner that a current for causing the reference voltage $V_{OCREF}$ and the voltage of the third node between the resistive elements 32 and 34 of the differential output buffer 12 to be equal to each other flows from the NMOS 22.

A voltage $V_{OD}$ having an amplitude of the differential signal output from the differential output buffer 12 is determined by a product ($V_{OD}=R_{TERM}\times I_{SS}$) of a resistance value $R_{TERM}$ of the terminating resistor 36 and a current $I_{SS}$ flowing to the terminating resistor 36. By properly regulating the constant current $I_{VOD}$ which flows to the NMOS 42 of the replica circuit 14, that is, a constant current $I_{VOD}$ to be supplied from the constant current source 50 of the constant current generating circuit 19, accordingly, it is possible to adjust the constant current $I_{SS}$ flowing to the differential output buffer 12, thereby regulating the amplitude of the differential signal to be output from the differential output buffer 12.

In the differential output buffer 12, a current for causing the voltage of the third node, that is, the common mode voltage of the differential signal output from the differential output buffer 12 to be equal to the reference voltage $V_{OCREF}$ flows to the NMOS 22 in response to the control signal input from the operational amplifier 16. By properly regulating the reference voltage $V_{OCREF}$, therefore, it is possible to adjust the common mode voltage.

As described above, the output buffer circuit 10 can maintain a higher speed operation under the same power consumption condition as compared with the output buffer circuit of the constant current type, and at the same time, can cancel the amplitude dependency of the common mode voltage as compared with the output buffer circuit of the constant voltage type and can independently regulate the amplitude and the common mode voltage in the differential signal, respectively.

With reference to a conceptual diagram of FIG. 2, description will be given to the common mode voltage $V_{OC}$ and the voltage $V_{OD}$ of the amplitude in the case in which the differential signal output from the differential output buffer 12 does not make a transition.

A common mode feedback control is carried out by the differential output buffer 12 through the operational amplifier 16. Therefore, the common mode voltage $V_{OC}$ and the reference voltage $V_{OCREF}$ always have a relationship of the following equation (1).

$$V_{OC}=V_{OCREF} \quad (1)$$

In the differential output buffer 12, $V_{OC}=(V_{TP}+V_{TM})/2$ is generated by the resistive elements 32 and 34 having a resistance value of $R_{TF}/2$ in order to carry out the common mode feedback control. The resistance value $R_{TF}$ of the resistive elements 32 and 34 has a sufficiently great value for the resistance value $R_{TERM}$ of the external terminating resistor 36. For this reason, it is possible to ignore the current flowing to the resistive elements 32 and 34.

Furthermore, the output buffer circuit 10 is designed to establish a relationship of the following equations (2) and (3), wherein an ON resistance of the PMOS 44 of the replica circuit 14 is represented by $R_{PI}$, a resistance value of the resistive element 46A obtained by simulating the terminating resistor 36 is represented by $R_{TI}/2$, an ON resistance of the PMOSs 24 and 26 in the differential output buffer 12 is represented by $R_{PF}$, and a ratio of the sizes of the replica circuit 14 and the differential output buffer 12 is represented by m.

$$R_{PI}=m*R_{PF} \quad (2)$$

$$R_{TI}=m*R_{TERM} \quad (3)$$

When a current to be supplied from the constant current source 50 of the constant current generating circuit 19 is represented by $I_{VOD}$, the NMOS 42 serving as the current source of the replica circuit 14 controlled to obtain $I_{VOD}*R_{TI}/2=V_{OD}/2$ is used, a source terminal potential of the NMOS 40 serving as the voltage source is represented by $V_{S\_}I$, and the current mirror circuit constituted by the NMOS 52 of the constant current generating circuit 19 and the NMOS 42 serving as the current source of the replica circuit 14 is set to have a mirror ratio of 1:1, a relationship of an equation (4) is obtained based on the equations (2) and (3).

$$V_{S\_}I=V_{OCREF}+(R_{PI}+R_{TI}/2)*I_{VOD} \quad (4)$$

The equation (4) utilizes that the voltage of the fourth node is controlled to be $V_{OCREF}$ because the common mode feedback control is carried out by the operational amplifier 18 in the replica circuit 14.

In addition, it is possible to obtain an equation (5), wherein a gate voltage and a voltage between a gate and a source in the NMOS 40 serving as the voltage source of the replica circuit 14 are represented by $V_G$ and $V_{GS\_}I$ respectively, and a source terminal voltage and a voltage between a gate and a source in the NMOS 20 serving as the voltage source of the differential output buffer 12 are represented by $V_{S\_}F$ and $V_{GS\_}F$ respectively.

$$\begin{aligned}V_S\_F &= V_G - V_{GS}\_F \\ &= V_S\_I + V_{GS}\_I - V_{GS}\_F \\ &= V_{OCREF} + (R_{PI} + R_{TI}/2)*I_{VOD} + V_{GS}\_I - V_{GS}\_F\end{aligned} \quad (5)$$

Moreover, the voltage $V_{OD}$ of the amplitude of the differential signal has a relationship of the following equation (6).

$$\begin{aligned}V_{OD} &= (V_S\_F - V_{OC})/(R_{PF} + R_{TERM}/2)*R_{TERM} \\ &= \left(\begin{array}{c}V_{OCREF} + (R_{PI} + R_{TI}/2)* \\ I_{VOD} + V_{GS}\_I - V_{GS}\_F - V_{OC}\end{array}\right) / (R_{PF} + R_{TERM}/2)* \\ &\quad R_{TERM}\end{aligned} \quad (6)$$

A relationship of an equation (7) is obtained, wherein a current flowing to the external terminating resistor 36 is represented by $I_{SS}$, $V_{OC}=V_{OCREF}$ is set because the operational amplifier 16 is used, and $V_{GS\_}I \approx V_{GS\_}F$ is set because the replica circuit 14 is used. By utilizing the replica circuit 14, it is possible to cancel the dependency of $R_{PF}$ of $V_{OC}$.

$$V_{OD} = (R_{PI} + R_{TI}/2) * I_{VOD}/(R_{PF} + R_{TERM}/2) * R_{TERM} \quad (7)$$

$$= (R_{PI} + R_{TI}/2)/\{m*(R_{PF} + R_{TERM}/2)\} * I_{SS} * R_{TERM}$$

Moreover, it is apparent that $(R_{PI}+R_{TI}/2)=m*(R_{PF}+R_{TERM}/2)$ is set from FIG. 2. Therefore, an equation (8) is derived from the equation (7).

$$V_{OD}=m*I_{VOD}*R_{TERM} \quad (8)$$

In other words, it is possible to determine $V_{OC}$ to be constant from "$V_{OD}=m*I_{VOD}*R_{TERM}$" of the equation (8) within a range in which the relationship of $V_{GS\_I} \approx V_{GS\_F}$ is established.

Accordingly, a relationship among the current $I_{SS}$ which flows to the external terminating resistor 36, the voltage $V_{OD}$ of the amplitude of the differential signal and the current $I_{VOD}$ to be supplied from the constant current source 50 of the constant current generating circuit 19 is expressed in equations (9) and (10).

$$V_{OD}=I_{SS}*R_{TERM} \quad (9)$$

$$I_{VOD}=I_{SS}/m \quad (10)$$

Subsequently, description will be given to an operation to be carried out when the differential output signal of the differential output buffer 12 makes a transition.

When the set of the PMOS 24 and the NMOS 30 is turned ON and the set of the PMOS 26 and the NMOS 28 is turned OFF in response to the differential signal input from the former circuit, the constant current $I_{SS}$ which is equal to the constant current $I_{VOD}$ flows from the power supply to the ground through the NMOS 20, the PMOS 24, the terminating resistor 36, the NMOS 30 and the NMOS 22. On the other hand, when the set of the PMOS 24 and the NMOS 30 is turned OFF and the set of the PMOS 26 and the NMOS 28 is turned ON, the constant current $I_{SS}$ flows from the power supply to the ground through the NMOS 20, the PMOS 26, the terminating resistor 36, the NMOS 28 and the NMOS 22.

When one of the nodes of the differential output signal is changed from H to L (that is, the other node is changed from L to H), $V_{GS}$ of the NMOS 20 is rapidly increased at the beginning that the output is varied. For this reason, an amount of the current flowing through the NMOS 20 is increased at a time so that an electric charge is supplied to a low potential node (a node outputting L) of the differential output buffer 12.

At this time, the $I_{SS}$ is equal to that obtained before the variation in the output. Consequently, the common potential (a potential of the node between the resistive elements 32 and 34) is started to be raised by the supply of the electric charge to the low potential node.

Since the common potential is raised, the operational amplifier 16 raises the gate voltage of the NMOS 22 in order to reduce the common potential in response. Correspondingly, the $I_{SS}$ is increased so that a slew rate of the differential output buffer 12 is increased.

In the case of the output buffer circuit of the constant current type, as described above, the slew rate of the differential signal is limited because of a high impedance caused by the current source, and the operating speed is lower under the same power consumption condition as compared with the output buffer circuit of the constant voltage type. On the other hand, in the output buffer circuit 10 according to the present preferred embodiment, the flowing current is increased more greatly for a period in which the output signal makes a transition as compared with a period in which the transition is not made. Consequently, the output signal can be caused to make a transition at a high speed. In other words, the output buffer circuit 10 according to the present preferred embodiment is operated as the output buffer circuit of the constant voltage type in place of the constant current type.

In the output buffer circuit 10 according to the present preferred embodiment shown in FIG. 1, the voltage of the node (the fourth node) at an opposite side to a side of the resistive element 46A which is connected to the PMOS 44 corresponding to the common mode voltage of the output signal is input to a negative terminals of the operational amplifier 18. However, it is also possible to input, to the terminal of the operational amplifier 18, the voltage of the node on the side of the resistive element 46A which is connected to the PMOS 44 corresponding to a high voltage of the output signal. Moreover, the replica circuit 14 may further have a structure in which another resistive element 46B having a resistance value that is a half of the resistance value of the external terminating resistor 36 and an NMOS 48 corresponding to the NMOS 28 or the NMOS 30 in the ON state of the differential output buffer 12 and having a gate connected to a power supply (a first power supply) are connected in series between the resistive element 46A and the NMOS 42 as shown in FIG. 3. The resistive element 46B and the NMOS 48 do not influence the operation of the replica circuit 14 at all. It is also possible to input, to the terminal of the operational amplifier 18, a voltage of a node on a side of the resistive element 46B connected to the NMOS 48 corresponding to the constant voltage of the output signal. In this case, it is also possible to omit the NMOS 48. In any case, a corresponding reference voltage is supplied to the positive terminal of the operational amplifier 18.

In the case in which a reference node of the replica circuit 14 is taken from a separate node from that in the first preferred embodiment as described above, control signals to be input to the positive terminals of the operational amplifier 18 of the replica circuit 14 and the operational amplifier 16 of the differential output buffer 12 cannot be identical to each other.

Figure 4:
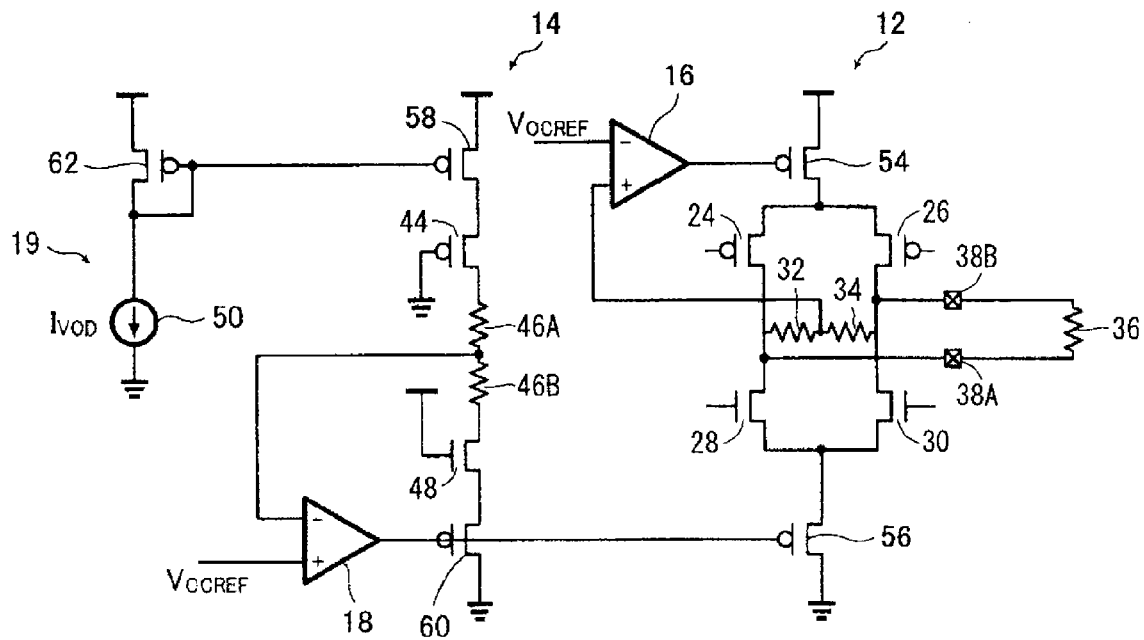
FIG. 4 is a circuit diagram showing a third preferred embodiment, illustrating the structure of the output buffer circuit according to the present invention.

Even if the other PMOS and NMOS except for the PMOS and NMOS of the differential switch in the differential output buffer 12 are replaced to constitute an output buffer circuit as shown in FIG. 4, moreover, it is possible to obtain a circuit for performing the same functions.

In this case, a PMOS 54 on a power supply side and a PMOS 56 on a ground side in the differential output buffer 12 serve as a current source and a voltage source of a source follower circuit respectively. Depending on this, a control signal sent from the operational amplifier 16 is input to a gate of the PMOS 54 serving as the current source and a control signal sent from the operational amplifier 18 is input to gates of the PMOS 56 on the ground side of the differential output buffer 12 and a PMOS 60 of the replica circuit 14 corresponding thereto. Moreover, the constant current source 50 of the constant current generating circuit 19 causes the constant current $I_{VOD}$ to flow from the power supply to the ground, and a current mirror circuit is constituted by a PMOS 62 of the constant current generating circuit 19 and a PMOS 58 serving as a current source of the replica circuit 14.

Moreover, the differential switch of the differential output buffer 12 can also be constituted by only a PMOS or only an NMOS in addition to a combination of the PMOS and the NMOS.

Figure 5:
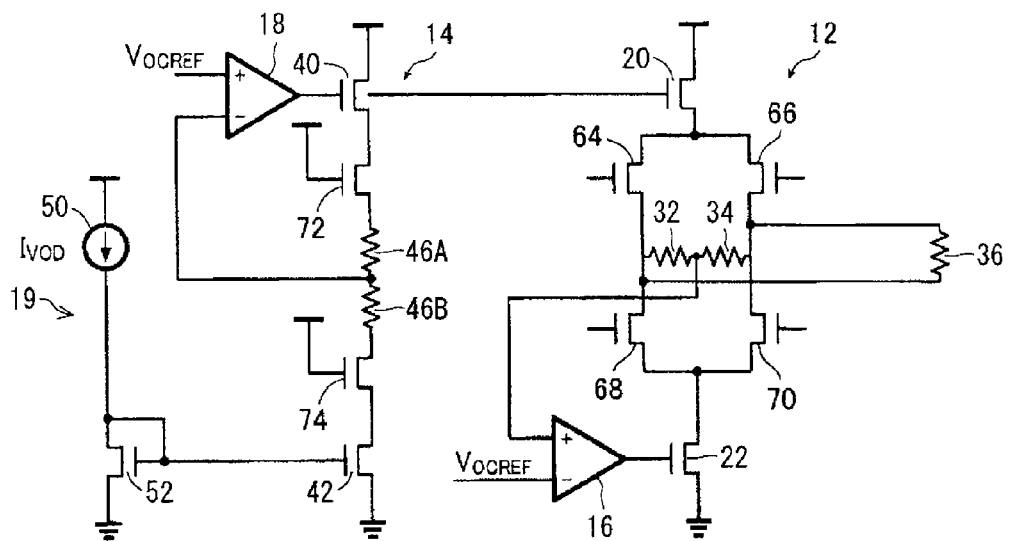
FIG. 5 is a circuit diagram showing a fourth preferred embodiment, illustrating the structure of the output buffer circuit according to the present invention.
Figure 6:
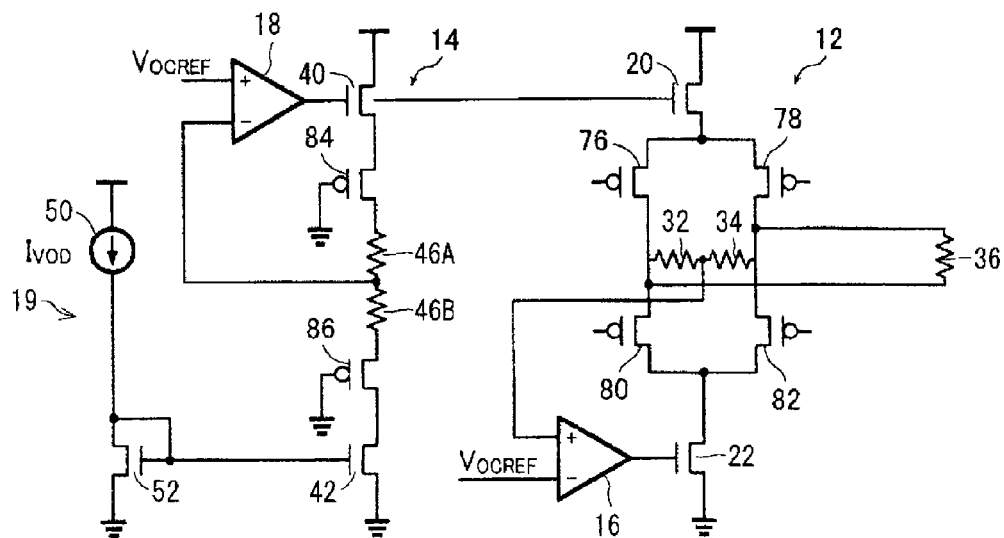
FIG. 6 is a circuit diagram showing a fifth preferred embodiment, illustrating the structure of the output buffer circuit according to the present invention.

In FIG. 5, a differential switch is constituted by only NMOSs 64, 66, 68 and 70. Depending on the structure of the differential switch, the replica circuit 14 corresponding to the differential switch is also changed to be constituted by NMOSs 72 and 74. Also in this case, a set of the NMOSs 64 and 70 and a set of the NMOSs 66 and 68 are controlled in such a manner that one of the sets is turned ON and the other set is turned OFF in response to a differential signal input from a former circuit. In FIG. 6, moreover, a differential switch and a replica circuit corresponding to the differential switch are constituted by only a PMOS. In the same manner as in FIG. 5, control is carried out in such a manner that one of the sets is turned ON and the other set is turned OFF in response to the differential signal input from the former circuit.

Figure 7:
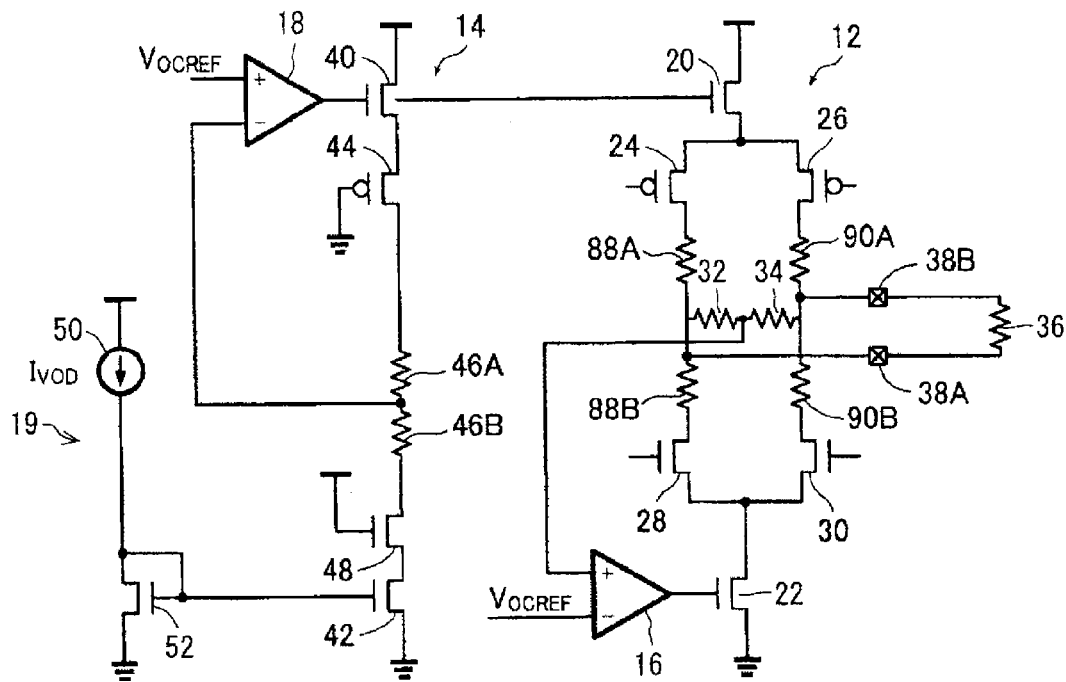
FIG. 7 is a circuit diagram showing a sixth preferred embodiment, illustrating the structure of the output buffer circuit according to the present invention.

As shown in FIG. 7, furthermore, resistive elements 88A and 88B (second and third resistive elements) are inserted in the first node between the PMOS 24 and the NMOS 28 in the differential output buffer 12, and resistive elements 90A and 90B (seventh and eight resistive elements) are inserted in the second node between the PMOS 26 and the NMOS 30 in the differential output buffer 12. The resistance values of the resistive element 88A and the restive element 90A are equalized to each other, and the resistance values of the resistive element 88B and the restive element 90B are equalized to each other. In this case, the resistant values may be different between the set of the resistive elements 88A and 90A and the set of the resistive elements 88B and 90B.

In the case of the example shown in FIG. 7, a resistive element 88A is connected to the first node between the PMOS 24 and the external output terminal 38A, and a resistive element 88B is connected to the first node between the external output terminal 38A and the NMOS 28. Moreover, a resistive element 90A is connected to the second node between the PMOS 26 and the external output terminal 38B, and a resistive element 90B is connected to the second node between the external output terminal 38B and the NMOS 30. The resistive elements 88A and 88B, and 90A and 90B may have a resistance value which is a half of the resistance value of the terminating resistor.

In some cases in which the differential switch is constituted by an MOS, a variation in manufacture or the like is generated in an ON resistance of the MOS. On the other hand, by inserting a resistive element having a smaller variation than the ON resistance of the MOS, it is possible to decrease a variation in a resistance value of their combined resistance. Thus, it is possible to reduce influence of the variation in the ON resistance of the MOS.

The resistive elements 88A and 88B are not connected between the PMOS 24 and the NMOS 28 but may be connected to a node between the node provided between the PMOS 24 and the NMOS 28 and the external output terminal 38A. The resistive elements 90A and 90B may also be connected in the same manner.

The first voltage source, the first current source and the differential switch of the differential output buffer 12 and the second voltage source, the second current source and the fifth switch of the replica circuit 14 corresponding thereto, and the like are not limited to be constituted by the MOS, and furthermore, may be constituted by different circuits for performing the same functions.

The third power supply may supply the same voltage as that of the second power supply, for example, the ground as in the preferred embodiment or may supply a different voltage from that of the second power supply, for example, a predetermined low voltage. Referring to the first power supply, moreover, a source voltage may be different in the replica circuit 14 and the differential output buffer 12.

If a voltage control circuit generates a control signal for controlling a voltage to be supplied from the NMOS 40 to the replica circuit 14 in such a manner that a reference voltage is equal to a voltage of a predetermined node (the fourth node in the present preferred embodiment) between the NMOS 40 and the NMOS 42, and controls a voltage to be supplied from the NMOS 40 and the NMOS 20 to the respective circuits in response to the control signal output from the voltage control circuit, it may have any structure.

Moreover, the third node and the fourth node do not correspond to each other but a different node from that in the preferred embodiment can also be selected. For example, a node between the third and fourth switches and the current source can be selected as the third node. Moreover, it is possible to select, as the fourth node, any node excluding the output terminal of the second voltage source in the current path of the replica circuit. In other words, it is possible to use separate reference voltages without requiring to utilize the same reference voltage $V_{OCREF}$ in a current control circuit and a voltage control circuit.

Figure 8:
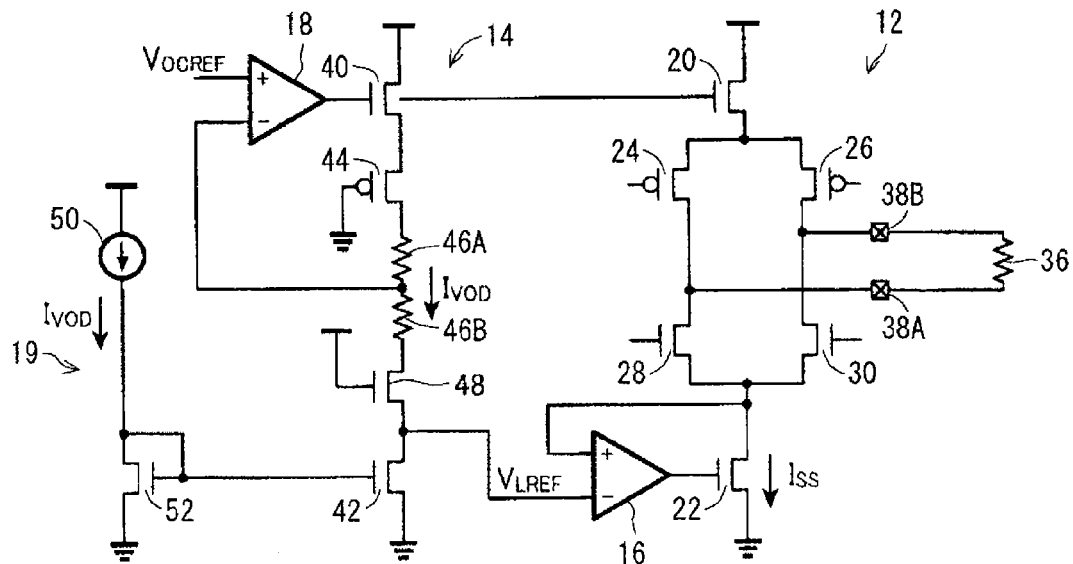
FIG. 8 is a circuit diagram showing a seventh preferred embodiment, illustrating the structure of the output buffer circuit according to the present invention.
Figure 9:
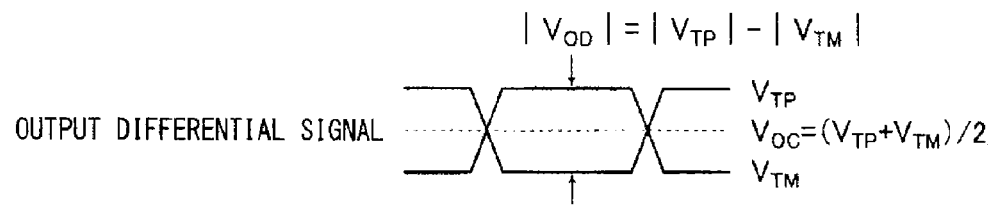
FIG. 9 is a conceptual diagram showing a relationship among a high-potential voltage $V_{TP}$, a low-potential voltage $V_{TM}$, an amplitude voltage $V_{OD}$, and a common mode voltage $V_{OC}$ in an output differential signal.
Figure 10:
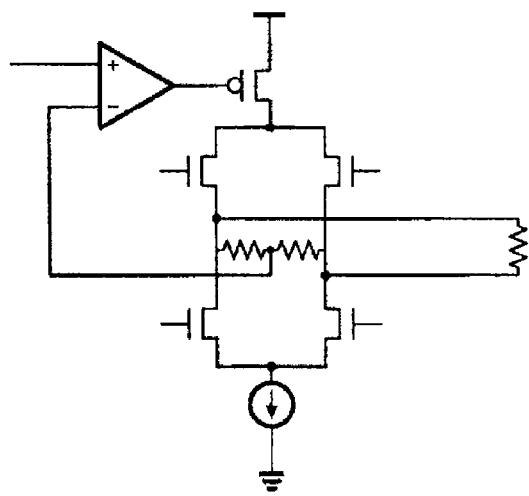
FIGS. 10 to 13 are circuit diagrams each showing an example of a structure of an output buffer circuit of a constant current type according to the related art.
Figure 11:
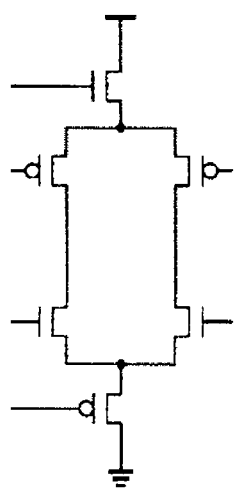
Figure 12:
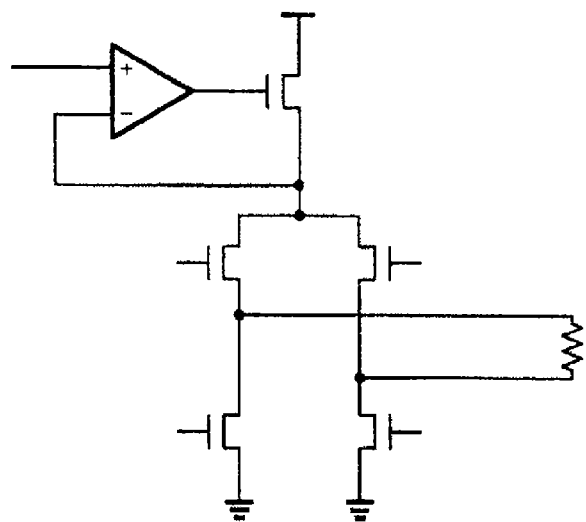
Figure 13:
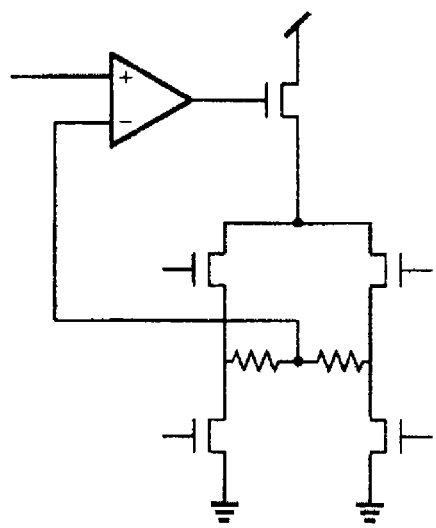

For example, as shown in FIG. 8, the reference voltage to be used in the current control circuit is not $V_{OCREF}$ but a node ($V_{LREF}$) between the NMOS 48 and the NMOS 42 corresponding to the node between the NMOSs 28 and 30 and the NMOS 22 in the differential output buffer 12 is used in the replica circuit 14.

In the case of FIG. 8, moreover, there is employed a method of taking a reference voltage from the replica circuit 14 and carrying out control without controlling $V_{OCREF}$ for the third node from an outside.

In the case of the present preferred embodiment, if a node corresponding to the third node is provided between the NMOSs 28 and 30 of the differential switch and the NMOS 22 of the current source, the voltage of the third node is regulated into a desirable voltage by the current control circuit so that the common mode voltage of the differential signal can be correspondingly regulated into a desirable voltage as a result.

In the case in which a circuit for generating $V_{LREF}$ is prepared separately, it is possible to omit one of $R_{TT}/2$ and the NMOS 48 from the replica circuit 14.

The present invention basically has the structure described above.

While the invention has been shown and described in detail, the foregoing description is in all aspects illustrative and not restrictive. It is therefore understood that numerous modifications and variations can be devised without departing from the scope of the invention.

What is claimed is:

1. An output buffer circuit comprising:
a differential output buffer, a replica circuit, a current control circuit, and a voltage control circuit, wherein
said differential output buffer includes a first voltage source, a current source, and first and third switches and second and fourth switches which are connected in series respectively between an output terminal of said first voltage source and said current source, a terminating resistor is connected between a first node between said first and third switches and a second node between said second and fourth switches, and a differential output signal is output to the terminating resistor,
a set of said first and fourth switches and a set of said second and third switches are controlled in such a manner that one of said sets is turned ON and the other set is turned OFF in response to a differential input signal,
said current control circuit controls a current which flows to said current source in such a manner that a voltage of a third node is equal to a preset first reference voltage, said third node being a node between two resistive elements, each having an equal resistance value, and connected in series between said first node and said second node, said replica circuit includes at least a second voltage source which is controlled in response to a common control signal to said first voltage source and outputs the same voltage as that generated by the first voltage source to an output terminal, a fifth switch which is connected to the output terminal of the second voltage source, and a constant current source for causing a constant current to flow to a current path including said second voltage source and said fifth switch, and said voltage control circuit generates the common control signal in such a manner that a voltage of a fourth node is equal to a preset second reference voltage, said fourth node being any node between the fifth switch and the constant current source in the current path of said replica circuit through which said constant current flows, and said first reference voltage is set as a central value of an amplitude of said differential output signal, and said first voltage source, said second voltage source, said current source, and said constant current source each include a MOS transistor of the same conductivity type.

2. The output buffer circuit according to claim 1, wherein the current path of said replica circuit further includes a first resistive element having a resistance value which is equivalent to a half of a resistance value of said terminating resistor and connected to the output terminal of said second voltage source through said fifth switch, and said fourth node is a node provided on an opposite side of the first resistive element to said fifth switch.

3. The output buffer circuit according to claim 2, wherein said first reference voltage and said second reference voltage have the same voltage value.

4. The output buffer circuit according to claim 1, wherein said current path of said replica circuit further includes a sixth resistive element having a resistance value which is equivalent to one half of a resistance value of said terminating resistor and connected to said output terminal of said second voltage source through said fifth switch, and said fourth node is a node provided on an opposite side to said fifth switch in said sixth resistive element.

5. The output buffer circuit according to claim 1 further comprising an amplitude regulating circuit for regulating the constant current caused to flow by said constant current source depending on an amplitude of said differential output signal.

6. The output buffer circuit according to claim 1 further comprising:
    second and third resistive elements inserted in said first node; and
    seventh and eighth resistive elements inserted in said second node.

* * * * *